US012100932B2

(12) United States Patent
Gijbels

(10) Patent No.: US 12,100,932 B2
(45) Date of Patent: Sep. 24, 2024

(54) ENHANCED EYE-SAFE LASER BASED LIGHTING

(71) Applicant: Jabil Inc., St. Petersburg, FL (US)

(72) Inventor: Tony Gijbels, Meeuwen (BE)

(73) Assignee: Jabil Inc., St. Petersburg, FL (US)

( * ) Notice: Subject to any disclaimer, the term of this patent is extended or adjusted under 35 U.S.C. 154(b) by 0 days.

(21) Appl. No.: 15/580,900

(22) PCT Filed: Jun. 7, 2016

(86) PCT No.: PCT/EP2016/062913
§ 371 (c)(1),
(2) Date: Dec. 8, 2017

(87) PCT Pub. No.: WO2016/198408
PCT Pub. Date: Dec. 15, 2016

(65) Prior Publication Data
US 2018/0166853 A1   Jun. 14, 2018

(30) Foreign Application Priority Data
Jun. 8, 2015 (EP) ..................................... 15171015

(51) Int. Cl.
*H01S 5/00*      (2006.01)
*H01S 5/06*      (2006.01)
(Continued)

(52) U.S. Cl.
CPC .......... *H01S 5/0683* (2013.01); *H01S 5/0021* (2013.01); *H01S 5/0087* (2021.01); *H01S 5/0617* (2013.01); *H01S 5/4025* (2013.01)

(58) Field of Classification Search
CPC .................................................. H01S 5/0021
See application file for complete search history.

(56) References Cited

U.S. PATENT DOCUMENTS 8,969,903 B2 * 3/2015 Yamanaka ............... H01L 33/58
                                                              257/79
9,588,326 B2 * 3/2017 Schwedt ................... G02F 1/29
(Continued)

FOREIGN PATENT DOCUMENTS

| DE | 10 2012 215702 A1 | 3/2014 |
| WO | 2010/004477 A2 | 1/2010 |
| WO | 2013/135271 A1 | 9/2013 |

OTHER PUBLICATIONS

International Search Report pertaining to International Application No. PCT/EP2016/062913, filed Jun. 7, 2016, 4 pages.
(Continued)

*Primary Examiner* — Tod T Van Roy
(74) *Attorney, Agent, or Firm* — Young Basile Hanlon & MacFarlane, P.C.

(57) ABSTRACT

A laser-based light source (10), comprising: at least one first arrangement (100), for generating light (500), comprising: a laser device (200) for generating laser light (510) of a predetermined laser wavelength and emitting this laser light as a laser beam; and a light-conversion device (210) for converting at least part of the laser light into converted light (520); a second arrangement (110)), for generating at least a first signal (300) and a second signal (310), representative for a different part of the spectrum of said light, from direct measurements on a portion of said light (500); and a controller (120) for receiving the first signal and the second signal, for determining a safe-to-operate parameter, based on the first signal and the second signal, and for controlling the operation of the laser-device based on a comparison between the safe-to-operate parameter and at least one predefined threshold.

18 Claims, 4 Drawing Sheets

(51) Int. Cl.
*H01S 5/0683* (2006.01)
*H01S 5/40* (2006.01)

(56) References Cited

U.S. PATENT DOCUMENTS

| 11,079,666 B2* | 8/2021 | Akagawa | G03B 21/206 |
| 2007/0149858 A1* | 6/2007 | Ogawa | A61B 1/0051 |
| | | | 600/181 |
| 2008/0013574 A1* | 1/2008 | Furuya | H01S 3/0675 |
| | | | 372/6 |
| 2008/0142816 A1* | 6/2008 | Bierhuizen | F21K 9/00 |
| | | | 257/82 |
| 2011/0109961 A1* | 5/2011 | Hayashi | G02B 21/0032 |
| | | | 359/385 |
| 2011/0116520 A1 | 5/2011 | Krijn et al. | |
| 2015/0153020 A1* | 6/2015 | Akiyama | H04N 9/3161 |
| | | | 362/19 |

OTHER PUBLICATIONS

Written Opinion pertaining to International Application No. PCT/EP2016/062913, filed Jun. 7, 2016, 5 pages.
European Extended Search Report pertaining to EP15171015.9, filed Jun. 8, 2015, 6 pages.

* cited by examiner

ENHANCED EYE-SAFE LASER BASED LIGHTING

FIELD OF THE INVENTION

The field of the invention relates to light source systems, subsystems or arrangements and control methods thereof, including computer implemented methods and related storage media, especially adapted for enhanced eye-safety.

BACKGROUND

A laser-based light source and related control methods provided with safe-to-operate (in terms of eye-safety) capabilities are known from DE 10 2012 215 702 and US 2011/0116520, hereby fully incorporated by reference. Such laser-based light sources, relying on phosphor conversion, have the advantage that they are bright. Such light sources are ideal for automotive headlamps and spot-lights. However, one critical issue with laser-based lighting is the fact that the light source should adhere to strict legislation and be eye-safe under all circumstances. Even small amounts of blue laser light in very bright white light cannot be tolerated for the eye-safety.

The accuracy of control methods for such systems provided with safe-to-operate (in terms of eye-safety) capabilities determines the safety margin that one must apply when relying on such methods. Further the details of such methods determine the type of safe-to-operate capabilities that can be provided. Moreover the final eye safety is not only determined by the laser source and the phosphor conversion as all components in the light path influence the final light generated.

AIM OF THE INVENTION

It is the aim of the invention to provide light source systems, subsystems and control methods thereof, including computer implemented methods and related storage media, with enhanced safe-to-operate (in terms of eye-safety) capabilities, compared to the prior-art, in that a lower safety margin can be applied without jeopardizing the eye safety (and hence resulting in a higher life time of the system) and/or generating information on when the light source systems will likely go into failure (and hence pro-active maintenance can be scheduled).

Another aim is to provide a light source systems, subsystems and control methods thereof that can be applied at any place in the optical path of the entire system, enabling in overall failure detection, hence including the influence of one or more other system components (such as but not limited laser sources, light convertors, illumination optics, matrix imagers, light decouplers, projection optics).

SUMMARY OF THE INVENTION

One contribution of the invention provides light source systems, subsystems and control methods thereof, including computer implemented methods and related storage media, with enhanced safe-to-operate (in terms of eye-safety) capabilities, by doing a spectral analysis of a representative portion of the total generated light source, independent on the laser light source.

Another contribution of the invention is to provide a (real-time or discrete) monitoring of one or more parameters for generating a prediction (e.g. having a method enabling regional phosphor inspection) on when the light source systems will likely go into failure.

Yet another contribution of the invention is to provide a light source systems, subsystems and control methods thereof that can be applied at any place in the optical path of the entire system, enabling in overall failure detection, hence including the influence of one or more other system components (such as but not limited laser sources, light convertors, illumination optics, matrix imagers, light decouplers, projection optics).

Each combination of such contributions is possible.

Therefore in a first aspect of the invention a laser-based light source, comprising: a first arrangement, for generating light, comprising: a laser device for generating laser light of a predetermined laser wavelength and emitting this laser light as a laser beam; and a light-conversion device for converting at least part of the laser light into converted light; a second arrangement, for generating at least a first signal and a second signal representative for a different part of the spectrum of said light, from direct measurements on a portion of said light; and a controller for receiving the first signal and the second signal, for determining a safe-to-operate information, based on the first signal and the second signal (e.g. for enabling controlling the operation of the laser-device based on a comparison between the safe-to-operate parameter and at least one predefined threshold). Also, the dedicated ratio measures of the first signal and the second signal result in safe-to-operate measures that are independent of the total brightness level.

In a second aspect of the invention a method (and related computer program product and non-transitory machine readable storage medium storing the computer program product) is provided for generating safe-to-operate information (e.g. suited for controlling a laser-based light source), comprising the steps of: receiving a plurality of signals (e.g. the first and second signals described above), representative for a different parts of the spectrum of said light and/or representative for different optical pathways, from direct measurements on a portion of said light; and computing in an electronic computing device, safe-to-operate information parameter, based on these plurality of signals (e.g. enabling further computing control signals for the operation of the laser-device, based on a comparison between the safe-to-operate parameter and at least one predefined threshold).

In an first embodiment of the invention by providing in between said first and second arrangement a matrix structure (such as an optical imager (e.g. digital micro mirror device)) (900), contributions to the light of the different places on the surface of the a light-conversion device, can be measured, hence resulting in a method enabling regional phosphor inspection. Based on analysis of such contribution a metric (for instance percentage of places already in failure) predicting the overall failure of the light source systems is made possible.

In an second embodiment of the invention, it is emphasized that between the first arrangement and the final light output a light path is followed with many optical subcomponents, each contributing to the final light characteristics, and hence the need to be able to inspect those. By providing means to decouple portion of light at one or more places in said light path, whereby said decoupled portions are fed to one or more second arrangements, safe-to-operate information on per subcomponent can be made and build therefrom more accurate overall safe-to-operate information of the entire light source systems is made possible.

The first and second embodiment of the invention can be combined.

DETAILED DESCRIPTION OF THE INVENTION

Figure 1:
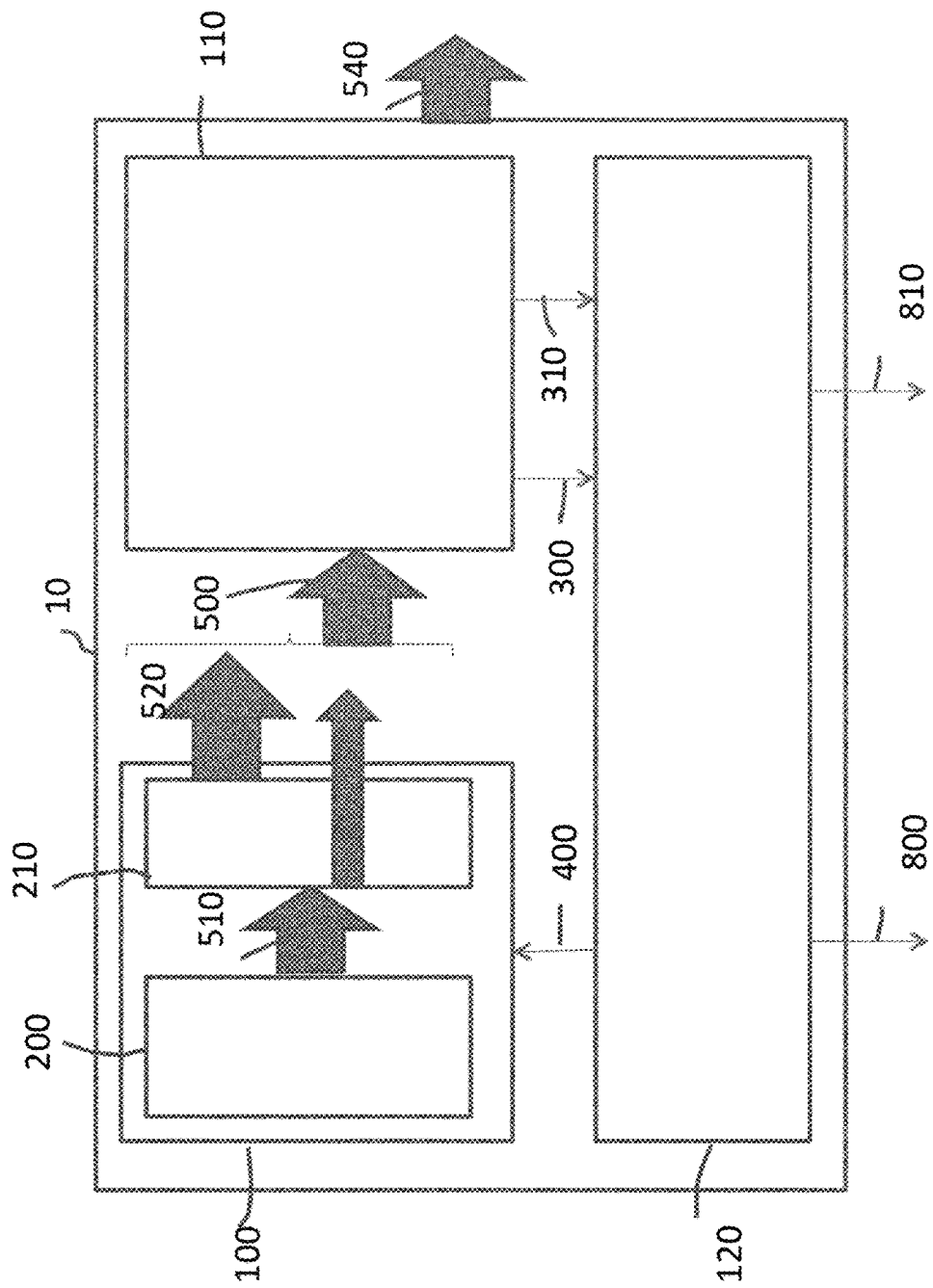
FIG. 1 provides a schematic view on the invention.

FIG. 1 illustrates a laser-based light source (10), providing light (540), comprising: at least one first arrangement (100), for generating light (500), comprising: a laser device (200) for generating laser light (510) of a predetermined laser wavelength and emitting this laser light as a laser beam; and a light-conversion device (210) for converting at least part of the laser light into converted light (520); a second arrangement (110), for generating at least a first signal (300) and a second signal (310), representative for a different part of the spectrum of said light, from direct measurements on a portion of said light (500); and a controller (120) for receiving the first signal and the second signal, for determining a safe-to-operate parameter, based on the first signal and the second signal, and for controlling the operation of the laser-device based on a comparison between the safe-to-operate parameter and at least one predefined threshold.

Figure 2:
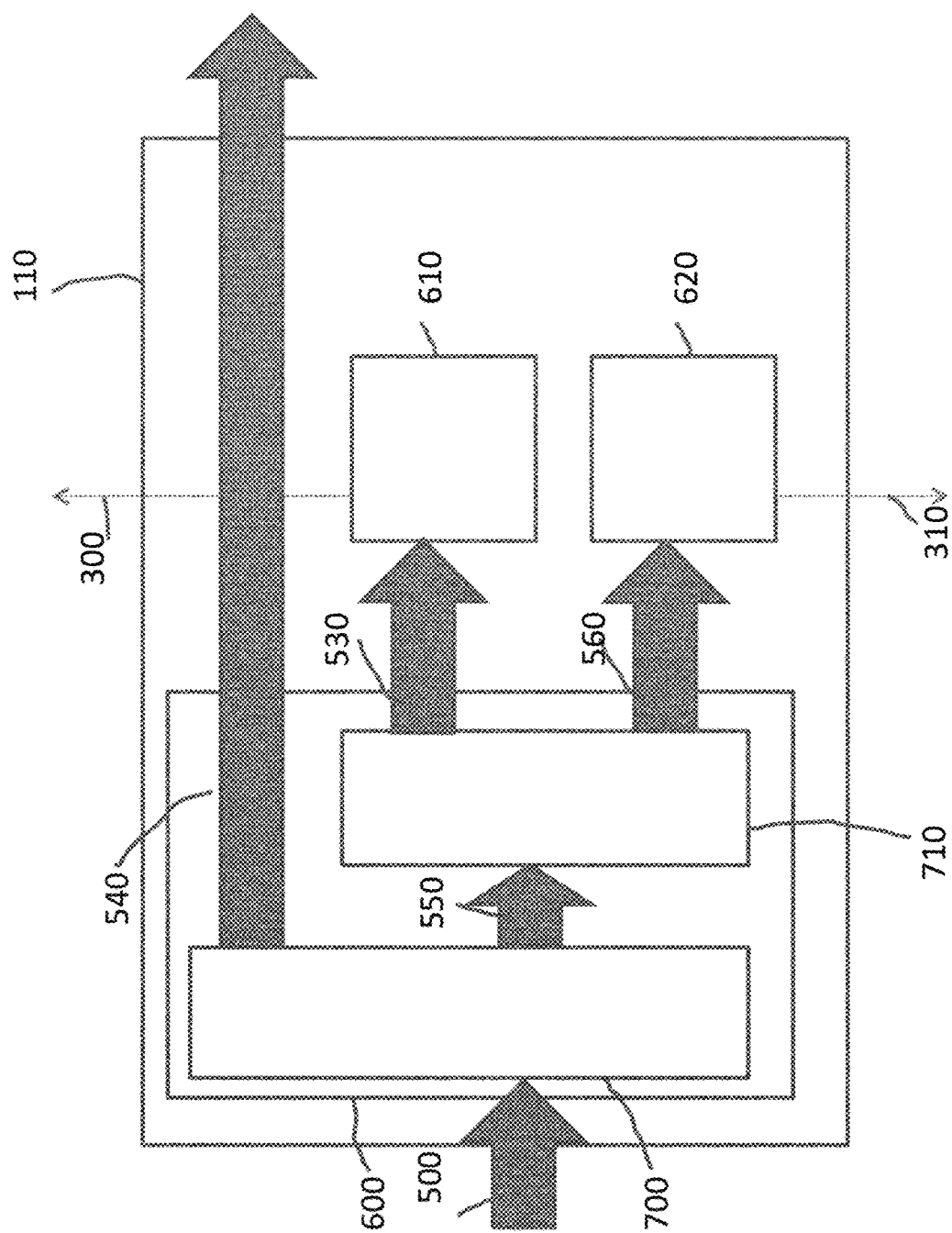
FIG. 2 provides a schematic view on a sub part of the invention.

FIG. 2 illustrates said second arrangement comprising: a means (600) for splitting a portion of the light (500) into (550). The decoupled portion (550) of the light is than split into a first beam (530) and a second beam (560), wherein said beams have a spectrum, wherein said spectra at least partially do not overlap; a first sensor (610) for determining the first signal being correlated with the portion of the light with the same spectrum as said first beam; a second sensor (620) for determining the second signal being correlated with the portion of the light with the same spectrum as said second beam; In an embodiment of the invention said means for splitting a portion of the light into a first beam and a second beam, wherein said beams have a spectrum, wherein said spectra at least partially do not overlap, comprises: a decoupler (700) for providing said portion of the light from said light; and a spectral splitter (710) for providing from said portion of light the first and the second beam.

Figure 3:
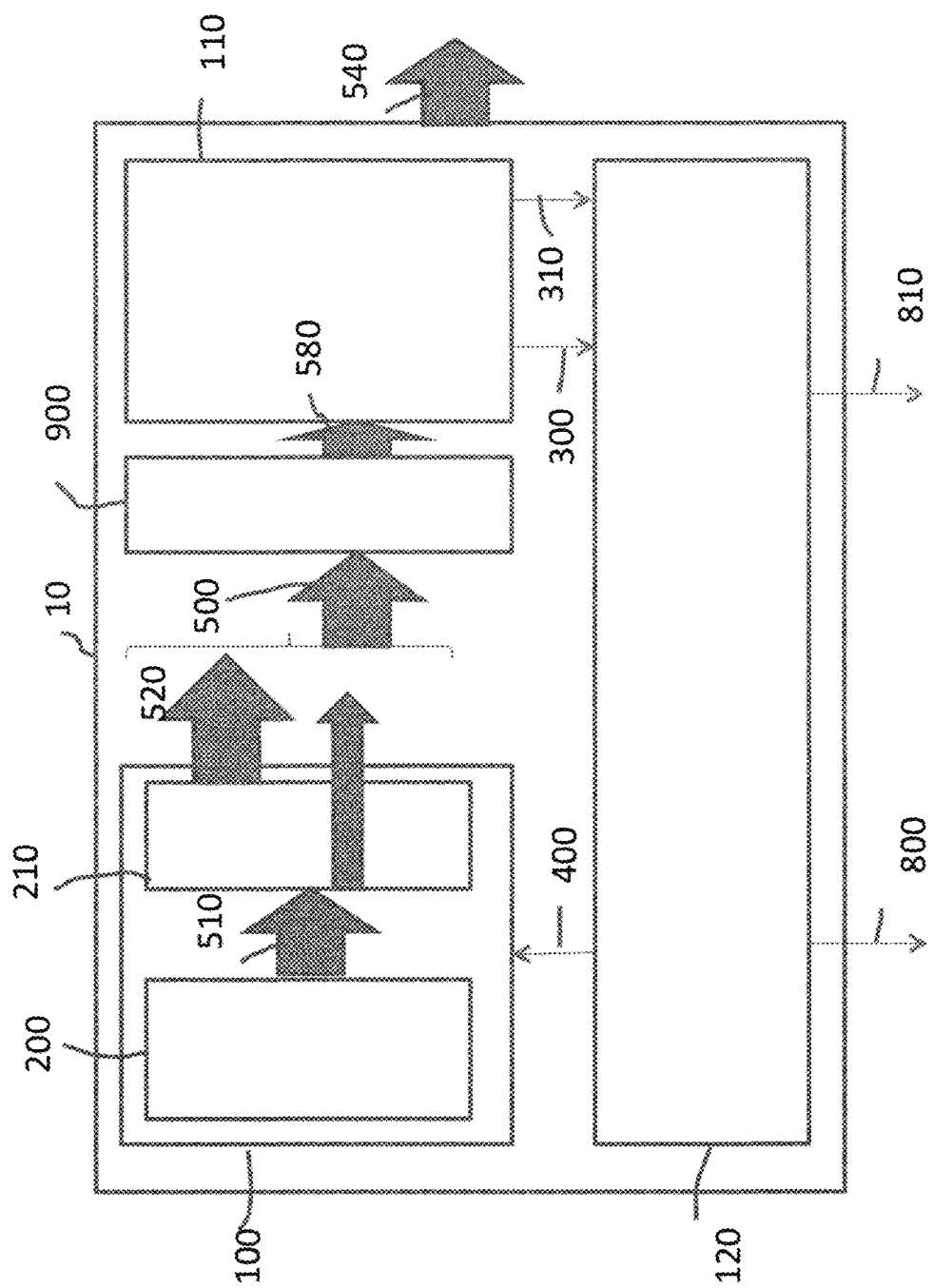
FIG. 3 provides a schematic view on an embodiment of the invention.
Figure 4:
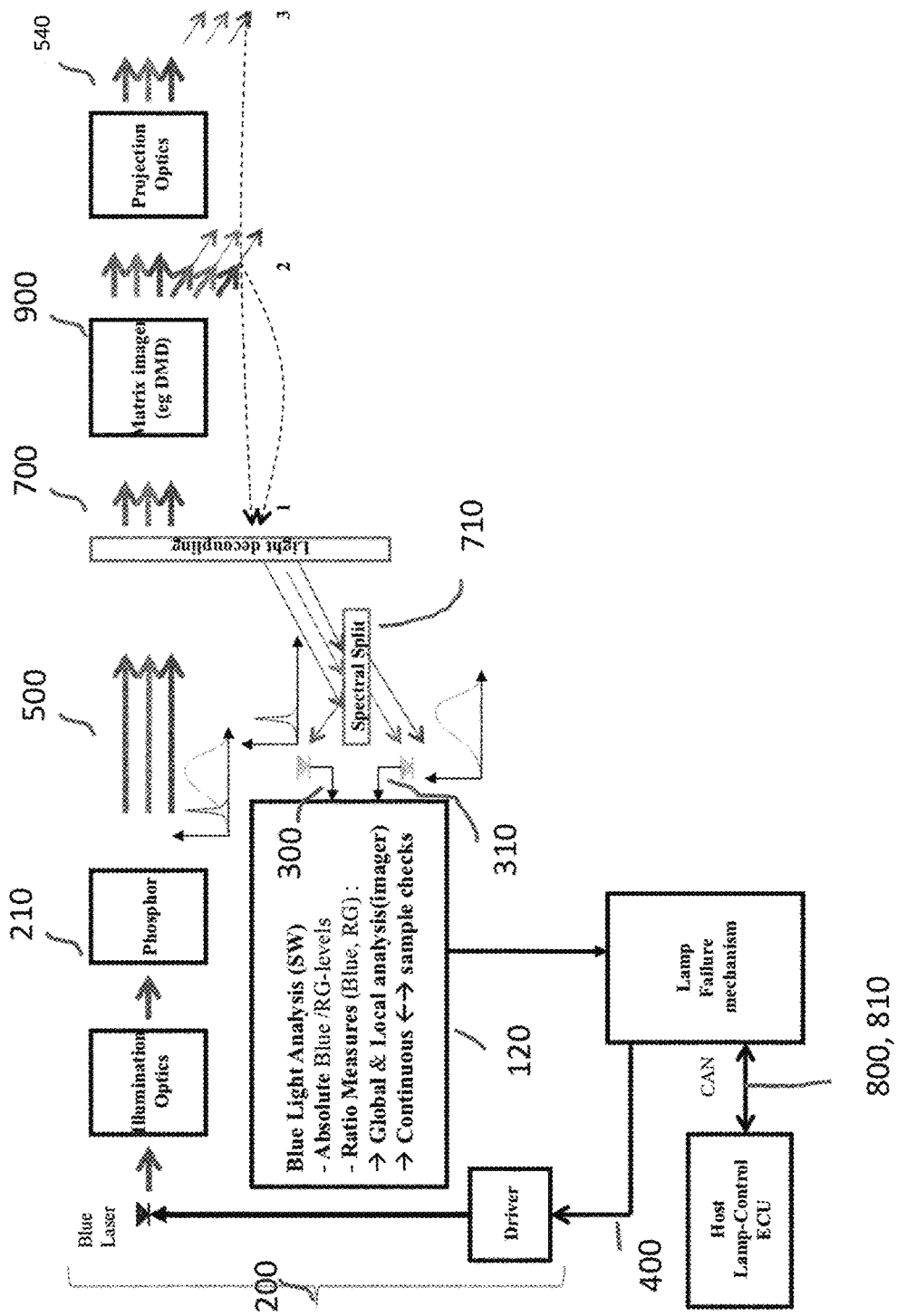
FIG. 4 provides a pictorial view on an embodiment of the invention.

FIG. 3 shows that in between said first and second arrangement a matrix structure (such as an optical imager (e.g. digital micro mirror device))(900) can be placed, such that instead of light (500), a selected portion (580), in terms of related to a certain portion of the surface of the light conversion device (210), can be fed into the second arrangement.

It is worth noting that within the invention laser light (510), converted light (520), generated light (being a combination of those) (500), the final output of the system (540) and the portion used within the second device (550) (or a selection thereof (580)) is distinguished. Moreover the serial path of the devices define an optical path, starting with the laser light (510) and the final output of the system (540). While the light conversion device (210) is an important cause of failure, it is clear that all up- and downstream components within the light path, do affect that characteristics of the final output of the system (540), which is the one to be eye safe. Use of more decouplers, actually after each subcomponent one believe deserve monitoring, and thereafter applying the concepts of the invention is possible. Further note that signals are generated by sensors (300, 310), while one or more computed signals (400, 800, 810), each being of a different kind (a warning signal (800), prediction information or failure information (810) for each of one or more of the optical components, or control signals for the laser device (400)) are determined.

Determining a safe-to-operate status for laser-based light source based on converted light needs to detect if the hazardous light level (like blue) inside the resulting light source is not too high. This light level is hard to detect accurately since it is only a fraction of the total (white) light. Therefore measuring the characteristics of the light is required in one or another way, especially its spectrum, and for eye-safety in particular specifications are put for such characteristics, in particular frequency or frequency domain dependent maxima are used in combination with overall maxima on some ratios of frequency or frequency domain dependent characteristics. Therefore accurate methods for determining those characteristics based on measurement are needed.

In US 2011/0116520 those measurements are on light contributions used for generating or created while generating the converted light, more in particular a portion of the laser light (the blue laser light source itself) and a reflected part of the additional generated yellow light by a light conversion device, while the final obtained light of the source is a combination (after passing collimating optics) of a non-converted portion of the laser light with the light generated by the light conversion device. More specifically in US 2011/0116520 measuring the laser source and the reflected part of the generated yellow light is performed. This makes that the accuracy of these measures are heavily dependent on the accuracy of the system component (laser light decoupling, reflectivity). As these optical components are also depending on environmental stress and aging), the accuracy of the measurements are heavily influenced by these parameters.

While in theory but in practice only to a certain accuracy level, the measured portions can be used to estimate characteristics of the light of the source, it is a contribution of the invention indicate that the safety margin that one must apply when relying on such methods heavily depend on the accuracy of methods and more in particular that the estimation of characteristics of the light of the source based on the measured portions as done in US 2011/0116520 is not accurate enough. Indeed the combination, the use of collimating optics and the optic pathway of the light contributions are all affecting the finally obtained light and these effects are difficult to model as would necessary to compute the frequency or frequency domain dependent characteristics the final obtained light from those light contribution measurements only. It is also indicated in US 2011/0116520 that these light contributions are not pure in terms of spectrum contribution and therefore equipping the sensors with color filters to enhance selectivity for the in the ideal case expected light is suggested.

Contrary to the prior-art in the invention the final light (being converted light and any non-converted portion of the laser light), possibly after use of collimating optics, is aimed at, more in particular an arrangement is provided for measuring of characteristics of the light, especially its spectrum, in particular frequency dependent or frequency domain dependent values of its spectrum. Therefore in the invention it is proposed to analyze the total resulting white light content in order to have a valid measure independent on the accuracy of the used optical components that are implemented before the measure and covering failure of all the implemented optical components before the analysis.

Moreover spectral analysis is required, more especially to detect the correct blue light which is only a small fraction of the total white light (as blue light is not measurable in the white light content only). In an embodiment of the invention by formulating dedicated ratio measures of the blue and yellow spectral components 2 additional important improvements are realized in that (i) the blue measurement and (2) the system failures that can lead to safety issues can be detected even with lower light level output (not yet violating any safety goal). This can help in service warning upfront the failure will take place (no non-operational time).

It must be emphasized that while it is the purpose to analyze the total resulting white light content that direct measuring of the total light is not possible due to high light level saturating the sensor. In the invention special measures are provided in that the second arrangement is adapted for performing direct measurements on a portion of said light (500) only.

The invented method is more accurate due to the ratio measure which is independent of the accuracy of light decoupling optics and all optics before (looking to a blue/ Yellow level ratio compared to the per design defined blue/Yellow-level ratio. Any changes during lifetime can be monitored).

Contrary to US 2011/0116520, due to the purposely choice of the invention, laser built-in photodiodes can no longer be used or at least does not provide one of the necessary two measurements as used in the invention.

Contrary to US 2011/0116520 with 2 (or 1 additional sensor in case of laser built-in photodiodes), a beam splitter to re-direct both a fraction of the laser light and a fraction of a reflected portion of the converted light, due to the purposely choice of the invention, more and different components, in particular 2 non-laser built-in sensors, a decoupler for directing a fraction of the light towards measurement capabilities, a splitter operating on said directed fraction of the light, are used.

Contrary to US 2011/0116520, one should no longer worry whether the signals are correlations of a source contribution (the laser or the converted light) nor on the precise correlation relationship to be used in the controller if such signals are used to determine, check or verify frequency dependent or frequency domain dependent values of the spectrum of the final light, as should be done.

In a further embodiment of the invention the light-conversion device for converting at least part of the laser light into converted light is based on phosphor conversion. In a further particular embodiment of the invention instead of controlling the operation of the laser-based light source in term of safe or not safe per se, generating a prediction, on when the light source systems will likely go into failure, is done (and hence pro-active maintenance can be scheduled). Such approach is enabled by performing an inspection of a portion of the volume or surface of phosphorous material. Indeed by use of a matrix illumination (Matrix laser sources or matrix imager (eg a digital micro mirror device or DMD) in the light generated by such portion can be evaluated. While the final light (in full operation of the system) comprises a sum of all contribution of the phosphor surface or volume, knowing the portion of the surface or volume already being in failure itself, provides important information to be used as a prediction. In essence in this embodiment between said first and second arrangement a matrix based illumination source or a matrix imager (e.g. digital micro mirror device) is placed; and no homogenizer is used after such device.

In a further embodiment of the invention the implementation of a matrix structure with illumination sources (e.g. with multiple laser LEDs) or with a matrix imager in the optical system, the light can be evaluated in small portions, depending on the optical system (no homogenizer) and the evaluation place (behind the imager), activating a part of the matrix sequentially. In this way local defects/degradation of the phosphor material can be detected already, while in the global detection this artifact is still not monitorable.

Note that in general between the output of the laser-based light source (10) and the at least one first arrangement (100), for generating light (500) a plurality of optical components (preferably in series) can be found, and that arrangements can be provided in that the second arrangement (110)) for generating at least a first signal (300) and a second signal (310) can selectively perform direct measurements on a portion of said light (500) travelled through different series of such optical components, thereby enabling failure detection on each of said optical components separately. In the invention all these signals can either be made simultaneously or (preferably at least for a portion) sequentially (and stored in memory in the controller) or combinations thereof. A means to steer the operation of the methods of the invention such as activating the digital mirror device in a proper way are available.

In conclusion one can state that the invented laser-based light source (10) is characterized by the presence of the second arrangement (110)), for generating at least a first signal (300) and a second signal (310), representative for a different part of the spectrum of said light, from direct measurements on a portion of said light (500); and an controller (120) adapted for receiving these first signal and the second signal and adapted for determining a safe-to-operate parameter, solely based on the first signal and the second signal, and for controlling the operation of the laser-device based on a comparison between the safe-to-operate parameter and at least one predefined threshold.

The invention claimed is:
1. A laser-based light source, comprising:
   at least one first arrangement configured to generate light, the at least one first arrangement comprising:
      a laser device configured to generate laser light of a predetermined laser wavelength and emit the laser light as a laser beam; and
      a light-conversion device configured to convert at least part of the laser light into converted light and transmit the converted light, wherein the light generated by the at least one first arrangement comprises the converted light transmitted by the light-conversion device and a non-converted portion of the laser light;
   a matrix structure configured to receive the light from the at least one first arrangement and output a selected portion of the light that is less than an entirety of the light received from the at least one first arrangement, and wherein the selected portion of the light is related to a portion of a volume or a surface of the light-conversion device that is less than an entirety of the volume or the surface of the light-conversion device;
   a second arrangement configured to receive the selected portion of the light output by the matrix structure and to generate at least a first signal and a second signal, wherein the first signal and the second signal are representative of different parts of a spectrum of the light, and wherein the second arrangement comprises:

a decoupler and a spectral splitter that is separate from the decoupler, the decoupler configured to provide a decoupled portion of the selected portion of the light directly to the spectral splitter, the spectral splitter configured to provide from the decoupled portion a first beam and a second beam, and wherein the first beam and the second beam are used to generate the first signal and the second signal; and a controller configured to receive the first signal and the second signal, configured to determine a safe-to-operate parameter based on the first signal and the second signal, and configured to control operation of the laser device based on a comparison between the safe-to-operate parameter and at least one predefined threshold, wherein the matrix structure is a digital micro mirror device;

wherein the light, the converted light, the non-converted portion of the laser light, the at least one first arrangement, and the second arrangement are in a light generating path, and wherein the controller receives the first signal and the second signal as the light travels in the light generating path.

2. The laser-based light source of claim 1, wherein the second arrangement further comprises:
a first sensor configured to determine the first signal, the first signal being correlated with the decoupled portion with a same spectrum as the first beam; and
a second sensor configured to determine the second signal, the second signal being correlated with the decoupled portion with a same spectrum as the second beam.

3. The laser-based light source of claim 2, wherein the first sensor is configured to receive a portion of the first beam.

4. The laser-based light source of claim 2, wherein the second sensor is configured to receive a portion of the second beam.

5. The laser-based light source of claim 1, wherein the determining of the safe-to-operate parameter is based on a ratio between the first signal and the second signal to enable safe-to-operate measures independently of a brightness level of the light.

6. The laser-based light source of claim 1, wherein the controlling the operation of the laser-based light source based on the comparison of the safe-to-operate parameter with the at least one predefined threshold comprises shutting down laser emission.

7. The laser-based light source of claim 1, wherein the matrix structure is positioned in between the at least one first arrangement and the second arrangement.

8. The laser-based light source of claim 1, wherein the controlling the operation of the laser-based light source based on the comparison of the safe-to-operate parameter with the predefined threshold comprises generating prediction information on when the light-conversion device will fail.

9. The laser-based light source of claim 1, comprising of a plurality of first arrangements arranged in an array structure, the plurality of first arrangements configured to output a sum of the light generated by each of the first arrangements of the plurality of first arrangements, wherein the second arrangement is configured to receive a selected portion of the sum of the light output by the matrix structure and generate at least the first signal and the second signal, wherein the first signal and the second signal are representative of different parts of a spectrum of the sum of the light, and wherein the controller is configured to control the operation of the laser device of each of the first arrangements of the plurality of first arrangements.

10. The laser-based light source of claim 1, wherein the at least one first arrangement comprises of a plurality of laser devices arranged in an array structure, wherein the light-conversion device is configured to convert at least part of the laser light generated by each of the laser devices into converted light, and wherein the controller is configured to control operation of each of the laser devices of the first arrangement.

11. The laser-based light source of claim 1, wherein the controlling the operation of the laser-based light source based on the comparison of the safe-to-operate parameter with the at least one predefined threshold comprises generating failure information for each of one or more optical components in between the at least one first arrangement and the second arrangement.

12. A method for controlling the laser-based light source of claim 1, comprising:
receiving the first signal and the second signal;
computing, in an electronic computing device, the safe-to-operate parameter based on the first signal and the second signal; and
controlling the operation of the laser device based on a comparison between the safe-to-operate parameter and the at least one predefined threshold.

13. A computer program product for executing the method of claim 12 on an electronic computing device.

14. A non-transitory machine readable storage medium storing the computer program product of claim 13.

15. The laser-based light source of claim 1, wherein each of the first beam and the second beam has respective spectrum, wherein the respective spectrum of the first beam and the respective spectrum of the second beam at least partially do not overlap, and wherein the second arrangement comprises:
a first sensor configured to determine the first signal, the first signal being correlated with the decoupled portion with a same spectrum as the first beam; and
a second sensor configured to determine the second signal, the second signal being correlated with the decoupled portion with a same spectrum as the second beam.

16. The laser-based light source of claim 1, wherein determining the safe-to-operate parameter includes detecting a presence of a hazardous blue light within the light.

17. A light source comprising:
a first arrangement, a digital micro mirror device, a second arrangement, and a controller, wherein:
the first arrangement is configured to generate light and comprises:
a laser device configured to generate laser light of a predetermined laser wavelength and to emit the laser light as a laser beam; and
a light-conversion device configured to convert at least part of the laser light emitted as the laser beam, into converted light;
the light comprises the converted light and a non-converted portion of the laser light;
the digital micro mirror device is configured to receive the light and transmit a portion of the light to the second arrangement, wherein the portion of the light is less than an entirety of the light received by the digital micro mirror device;
the second arrangement comprises:

a decoupler configured to receive the portion of the light from the digital micro mirror device and to output a decoupled portion of the portion of the light;

a spectral splitter configured to split the decoupled portion into a first beam and a second beam, wherein the first beam and the second beam each have a spectrum, and wherein the spectrum of the first beam the spectrum of the second beam at least partially do not overlap;

a first sensor configured to receive the first beam and to determine a first signal being correlated with the decoupled portion with a same spectrum as the first beam; and a second sensor configured to receive the second beam and to determine a second signal being correlated with the decoupled portion with a same spectrum as the second beam; and the controller is configured to:
  receive the first signal and the second signal;
  determine a safe-to-operate parameter based on the first signal and the second signal, wherein the safe-to-operate parameter is a ratio between the first signal and the second signal; and
  control operation of the laser device based on a comparison between the safe-to-operate parameter and at least one predefined threshold.

18. The light source of claim 17, wherein the digital micro mirror device is positioned between the first arrangement and the second arrangement.

\* \* \* \* \*